United States Patent [19]

Chamberlain et al.

[11] Patent Number: 5,235,197
[45] Date of Patent: Aug. 10, 1993

[54] HIGH PHOTOSENSITIVITY AND HIGH SPEED WIDE DYNAMIC RANGE CCD IMAGE SENSOR

[75] Inventors: Savvas G. Chamberlain; William D. Washkurak, both of Waterloo, Canada

[73] Assignee: Dalsa, Inc., Waterloo, Canada

[21] Appl. No.: 720,408

[22] Filed: Jun. 25, 1991

[51] Int. Cl.$^5$ .................. H01L 29/78; H01L 27/14; H01L 31/00
[52] U.S. Cl. .................. 257/230; 257/223; 257/234; 257/236; 377/60; 377/62; 358/213.31
[58] Field of Search .............. 357/24 LR, 24 M, 24; 377/60, 61, 62, 63; 358/213.16, 213.26, 213.29, 213.31; 257/223, 230, 234, 236

[56] References Cited

U.S. PATENT DOCUMENTS 4,473,836 9/1984 Chamberlain .
4,716,466 12/1987 Miida et al. ............... 357/24 LR

FOREIGN PATENT DOCUMENTS 63-190383 8/1988 Japan .................. 357/24 M

OTHER PUBLICATIONS

Gaffney et al., "Preventing Overload in Optical Scanners", IBM Technical Disclosure Bulletin, vol. 17, No. 8, May 1975.
An Improved Wide Dynamic Range Silicon Photodetector for Integration in Image Sensor Arrays; Doody, et al., Can. J. Phys. vol. 65, 1987.
A High Photosensitivity Wide Dynamic Range Silicon Linear Image Sensor Array; Doody, et al.
A High Speed, Wide Dynamic Range Linear Dynasensor CCD Detector Array for Acousto-Optic Applications; Washkurak, et al.

Primary Examiner—Andrew J. James
Assistant Examiner—Ngan Van Ngo
Attorney, Agent, or Firm—Fay, Sharpe, Beall, Fagan, Minnich & McKee

[57] ABSTRACT

A wide dynamic range photodetector comprising a photosensitive region for generating signal electrons in response to being illuminated, a collection region for storing the signal electrons generated within the photosensitive region, a shift register for receiving and outputting the signal electrons from the collection region, and a transfer gate intermediate the photosensitive region and the collection region for alternately facilitating transfer of the signal electrons from the photosensitive region for storage in the collection region, and isolating the photosensitive region from the collection region while the signal electrons are being output via the shift register.

9 Claims, 5 Drawing Sheets

HIGH PHOTOSENSITIVITY AND HIGH SPEED WIDE DYNAMIC RANGE CCD IMAGE SENSOR

FIELD OF THE INVENTION

This invention relates in general to photodetectors, and more particularly to a wide dynamic range photodetector having high photosensitivity and high speed at low light levels.

BACKGROUND OF THE INVENTION

Photodetectors are well known in consumer and industrial electronics for detecting light and in response generating a signal proportional thereto. For example, photodetectors have been integrated with CCD image sensors to form linear and area arrays useful in video technology.

U.S. Pat. No. 4,473,836 (Chamberlain) discloses an integral large dynamic range photodetector element for linear and area integrated circuit imaging arrays. This prior art patent teaches a new CCD image sensor technology with a photoelement for providing input power detecting dynamic range greater than one million. The prior art photodetector has been used successfully to form wide dynamic range CCD linear image sensor arrays.

Subsequent improvements have been made to the aforenoted photodetector, as reported in the following publications:

1. B. C. Doody and S. G. Chamberlain, "An improved wide dynamic range silicon photodetector for integration in image sensor arrays" Canadian Journal of Physics, Vol. 65, no. 8, pp. 919-923, 1987.
2. S. G. Chamberlain, B. C. Doody and W. D. Wahkurak, "A high photosensitivity wide dynamic range linear image sensor array" Electronic Imaging, pp.170-175, Mar. 28-31, 1988.
3. W. D. Washkurak, S. G. Chamberlain, and N. D. Prince, "High Speed wide dynamic range linear CCD detector for acousto-optic applications" SPIE Symposium and Advances in Optical Information Processing, Orlando, Fla., pp. 1-9, Apr. 4-8, 1988.

Although the wide dynamic range CCD photodetector discussed in the above references is capable of producing a detecting input power dynamic range greater than one million in commercial CCD linear image sensor arrays, the prior art device nevertheless suffers from a number of technological limitations.

Firstly, as with other prior art photodetectors, the photosensitivity or NEP (noise equivalent power) of the above-discussed wide dynamic range photodetector is a function of its own capacitance.

Secondly, the above-mentioned capacitance of the prior art photodetector also results in slow speed of operation in the presence of short light pulses.

Thirdly, the prior art photodetector exhibits poor photosensitivity response in the presence of short incoming light power pulses.

Finally, during the charge transfer process of the video signal into the CCD readout shift register of the prior art photodetector, the signal may be contaminated, or smeared by the incoming incident illumination. Furthermore, blooming can also occur at high light levels.

SUMMARY OF THE INVENTION

According to the present invention, a wide dynamic range photodetector is provided which exhibits high photosensitivity at low light levels, high speed and capability of integration to form CCD linear and area image sensor arrays. The properties of the photodetector of the present invention include, relative to the above-discussed prior art, lower capacitance, higher photosensitivity at low light levels, higher speed at low light levels, and no contamination of the signal by incoming light during signal charge transfer to the readout shift register. However, the photodetector according to the present invention also offers an input power detecting dynamic range of greater than one million, as with the above-referenced prior art device.

BRIEF DESCRIPTION OF THE DRAWINGS

A preferred embodiment of the present invention will be described in greater detail below with reference to following drawings, in which.

DETAILED DESCRIPTION OF THE PREFERRED EMBODIMENT

Figure 1:
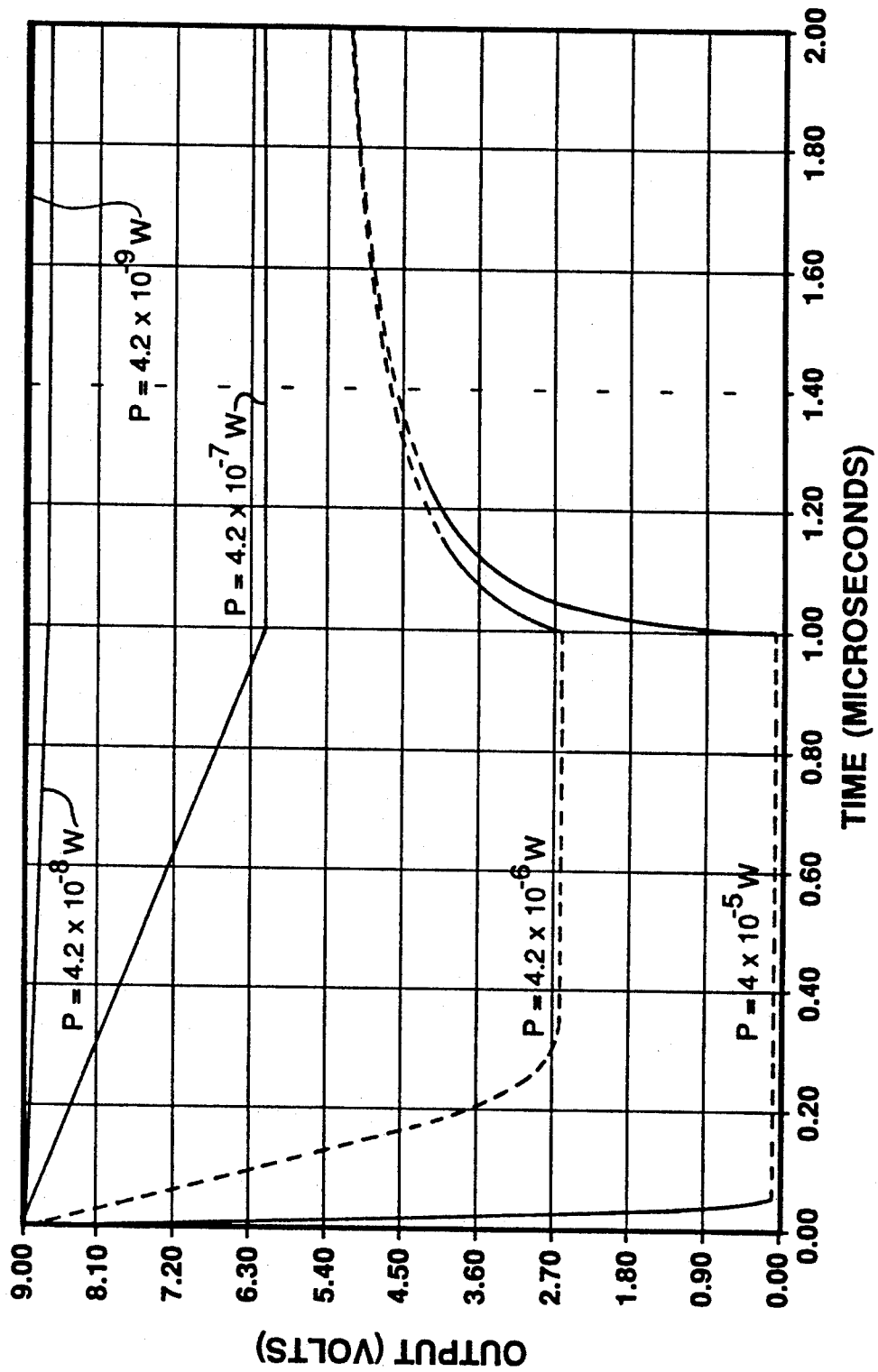
FIG. 1 is a graph of transient response of a conventional wide dynamic range photodetector in accordance with the prior art.

As discussed above with reference to the prior art, conventional photoelements suffer from slow speed of response in the presence of short light pulses. This is demonstrated clearly in FIG. 1 where the output response of a prior art photoelement is plotted as a function of time and incoming light intensity.

Figure 2A:
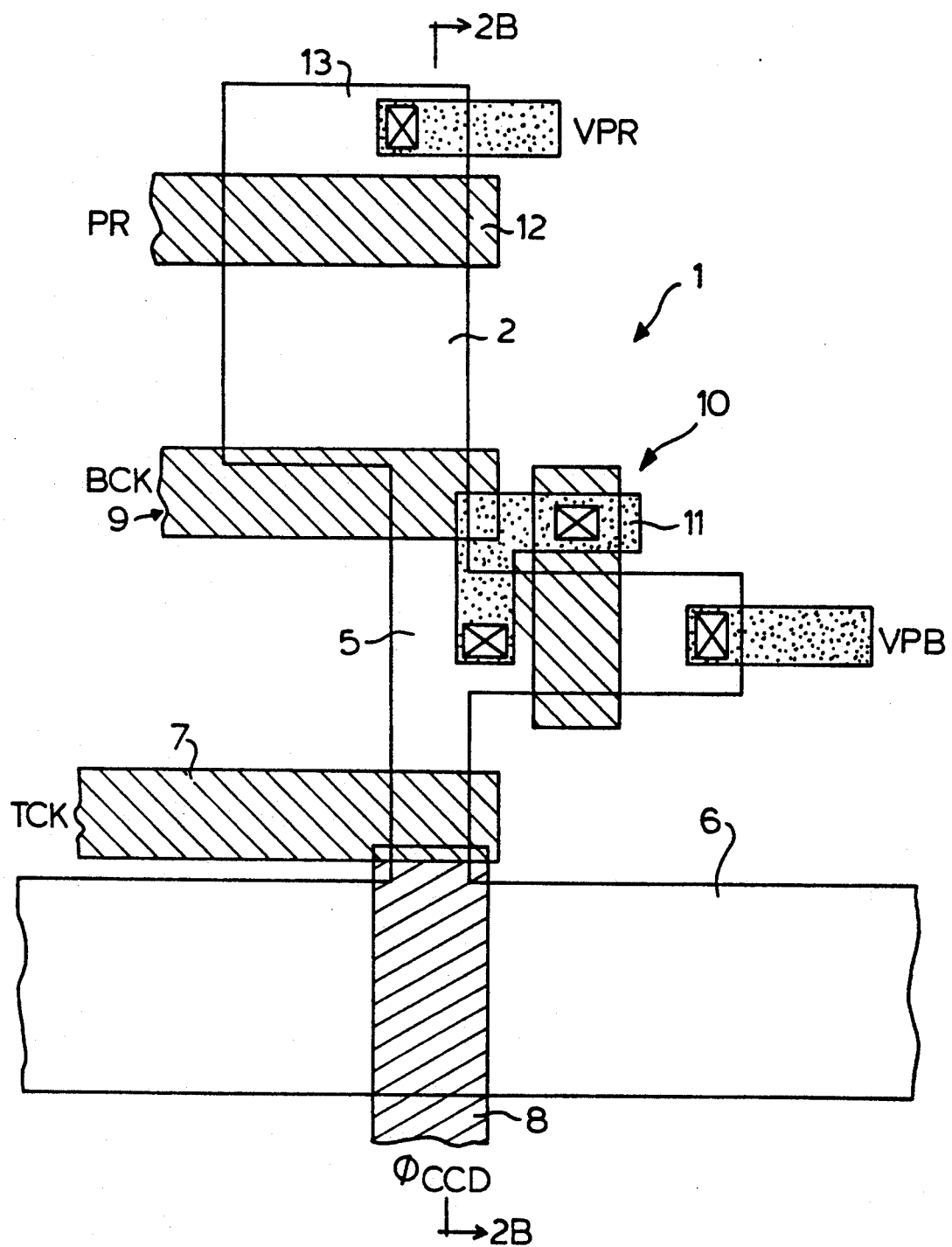
FIG. 2A is an integrated circuit layout for a photodetector in accordance with the preferred embodiment.
Figure 2B:
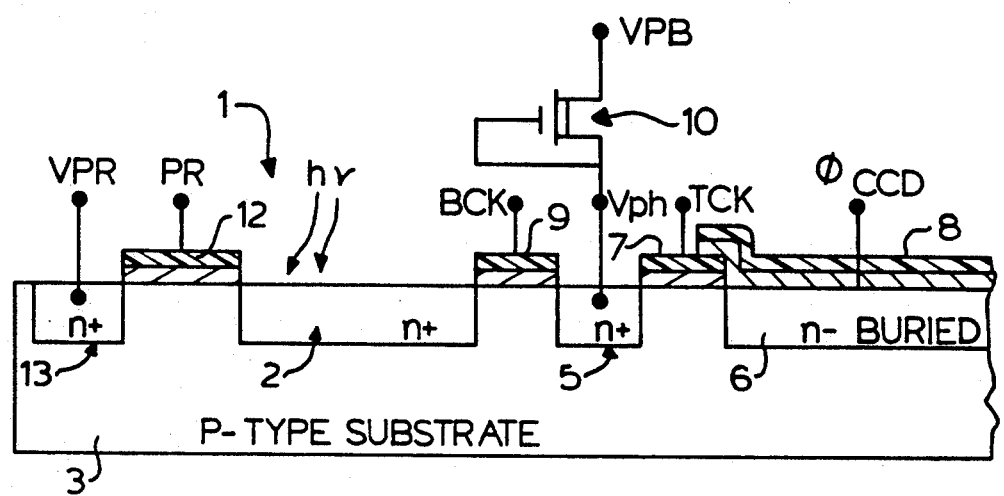
FIGS. 2B and 2C form a combined cross-sectional view and potential well diagram of the photodetector shown in FIG. 2A.
Figure 2C:
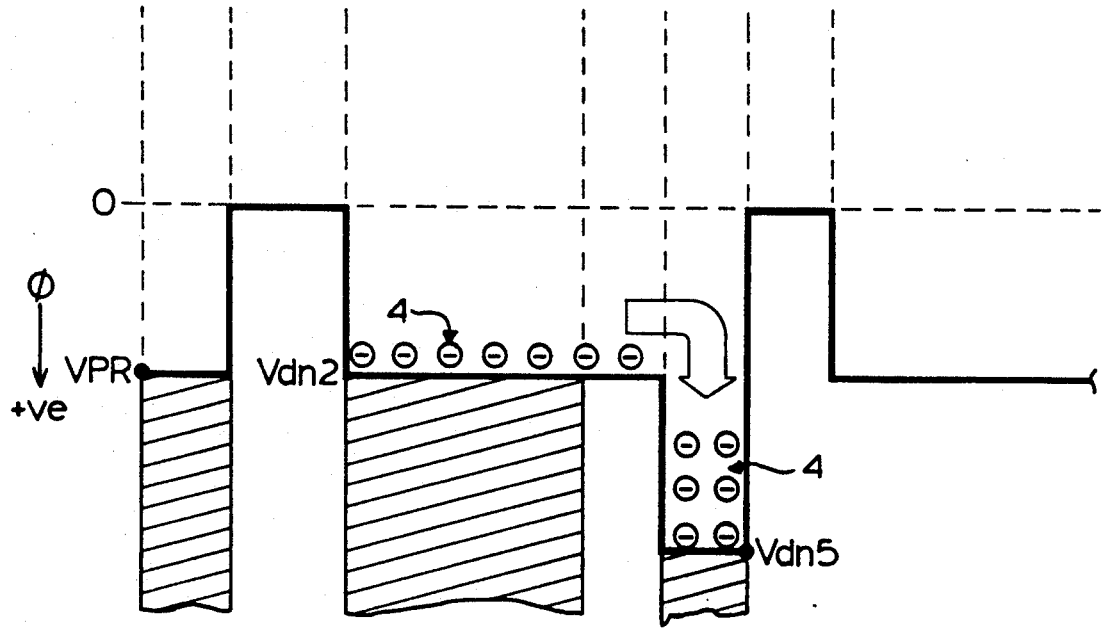

Turning to FIGS. 2A to 2C, a photodetector 1 is illustrated in accordance with the preferred embodiment of the present invention. The photodetector 1 comprises a photosensitive region 2 which, in accordance with the preferred embodiment is in the form an n+ diffusion into a P-type semiconductor substrate 3.

In accordance with well known principles of semiconductor physics, signal electrons 4 are generated within the photosensitive region 2 in response to illumination of the photosensitive region by light photons of specific frequency (h$\vee$) as shown in the potential well diagram of FIG. 2C.

The signal electrons 4 are collected in a collection region 5 which, in accordance with the preferred embodiment, comprises a further n+ diffusion in the P-type substrate 3.

Finally, the signal electrons 4 are output via a CCD readout shift register comprising an n-buried layer 6 forming an active region of the shift register, a transfer gate 7 of first level polysilicon and a CCD clocking gate 8 of second level polysilicon. The transfer gate 7 and CCD clocking gate 8 are clocked via signal pulses TCK and $\phi_{CCD}$, respectively.

In accordance with an aspect of the present invention, a further gate 9 is disposed intermediate the photosensitive region 2 and signal electron collection region 5, as will be discussed in greater detail below. The transfer gate 9 is clocked via a signal BCK.

A profiled device 10 is provided with a drain terminal connected to a source of bias voltage VPB and gate and source terminals interconnected via metalization layer 11, and further connected to the n+ collection diffusion 5.

The combination of the n+ diffusion 5 and the profiled device 10 shown in FIGS. 2A and 2B is equivalent to the prior art wide dynamic range device described in U.S. Pat. No. 4,473,836, with the exception that the region 5 in accordance with the present invention is not a photosensitive region.

Instead, photosensitive region 2 is isolated in accordance with the present invention by CCD gate 9. As shown in the potential well diagram of FIG. 2C, during integration and photocollection, photogenerated electrons 4 are collected by the potential well of the n+ diffusion 2. The signal BCK is maintained at a high level such that gate 9 is open and the photogenerated signal electrons 4 drift and diffuse and are collected by the diffusion region 5. This is clearly shown in the potential well diagram of FIG. 2C. As a result of the signal electrons collecting within region 5, the voltage of the diffusion region (Vdn5) decreases proportional to the signal charge being collected. The signal voltage (Vph) changes logarithmically as a function of the light intensity incident on photosensitive region 2. The change of the voltage of region 5 ($\Delta$Vph) as a function of the photocurrent is given by:

$$\Delta V_{ph} = K \ln \frac{I_{ph}}{I_{dc}}$$

where k represents the responsivity of the photodetector between incident light and voltage, $I_{dc}$ represents the leakage current of the region 5 and $I_{ph}$ represents the photocurrent of the diffusion 2 and is given by $$I_{ph} = \frac{qn\lambda HA}{hc}$$

where
- q is the electron charge in coulombs
- n is the quantum efficiency
- H is the light intensity in watts per cm square
- $\lambda$ is the wavelength of the incoming light in cm
- h is a Planck's constant
- c is the speed of light, and
- A is the area of the photosensitive diffusion region 2.

The potential of the diffusion 5 under dark conditions (Vdn5) is set through the profiled device 10. The voltage VPB is a DC bias supplied externally to the device 10. The potential of the light sensing diffusion 2 under dark conditions is set to Vdn2 by a reset gate 12 and the common drain bias VPR applied to drain diffusion 13. Once this potential is set, the control signal voltage PR is set to zero potential, thereby isolating the common drain 13 from the photosensing region 2.

In operation, charge is detected and shifted out of the photodetector 1 by initially applying a logic low level voltage BCK to the gate 9 and a high logic level voltage PR to the gate 12 for resetting the potential of diffusion region 2 to Vdn2, as discussed above. Next, the voltage PR drops to zero potential for isolating drain region 13 from photosensitive diffusion 2. In response to illumination, the signal electrons 4 are generated within diffusion 2. The BCK signal goes to a logic high level such that the signal electrons 4 drift and diffuse into the potential well provided collection region 5 which, as discussed above, is preset to a potential Vdn5 which is less than the potential Vdn2 of the diffusion region 2.

Next, the signal electrons 4 are charge transferred to the CCD readout shift register 6 by alternately pulsing the TCK and $\phi$CCD signals applied to gates 7 and 8. At the same time, the gate 9 is disabled by applying a logic low BCK signal thereto, for isolating the photosensitive region 2 from the collection region 5.

The photodetector of FIGS. 2A and 2B is characterized by two important advantages over prior art photodetectors.

Firstly, the dimensions of the diffusion region 5 can be made very small. This leads to a small node capacitance at region 5. A decrease in the capacitance results in a significant increase in the speed of response of the photodetector without sacrificing photosensitivity. Light pulses of width 90 nanoseconds or less can be detected at low light levels in accordance with the embodiment disclosed. In conventional prior art wide dynamic range photodetectors, any attempt to decrease the sensing node capacitance also results in significant decreases in photosensitivity, as discussed above.

Secondly, according to the photodetector of FIGS. 2A and 2B, during charge transfer of the signal into the CCD readout shift register 6, the transfer gate 9 is disabled. Therefore, the signal which is stored on collection diffusion 5 is isolated from the photosensitive region 2. This ensures that the incoming light incident photosensitive region 2 does not contaminate, smear or bloom the sampled video signal.

At the end of the integration period and after the signal charge has been transferred into the readout shift register 6, the photosensitive diffusion 2 is reset to the potential VPR by enabling gate 12 in response to applying a logic high level signal PR thereto.

An alternative embodiment of the present invention is illustrated with reference to FIGS. 3A and 3B. Identical reference numerals are used in FIGS. 3A and 3B to depict analogous functional elements of the preferred embodiment discussed above with reference to FIGS. 2A and 2B. However, whereas certain functional elements are configured with metalization layers in the preferred embodiment (e.g. CCD gate 8), according to the alternative embodiment first and second polysilicon layers may be substituted therefore, (e.g. polysilicon layer 8 in FIG. 3A and 3B).

Furthermore, whereas the preferred embodiment utilizes a collection diffusion 5 within the P-type substrate 3, the alternative embodiment incorporates a storage gate 14 for creating a potential well for storing signal electrons 4.

In accordance with the alternative embodiment, the dark potential of the photosensing region 2 is set by the wide dynamic range structure 10 to a bias voltage of VPB. During integration, the diffusion 2 collects photogenerated electrons 4, as shown in the potential well diagram of FIG. 3C. However, instead of being stored under a dedicated potential well (e.g. diffusion 5 in FIGS. 2A and 2B), the signal electrons 4 are directed to storage gate 14 having a logic high level control signal SCK applied thereto.

During photointegration, the gate 9 is enabled via a logic high level signal BCK simultaneously with the storage gate 14 being enabled. The collected photogenerated electrons diffuse from the diffusion 2 into the potential well created by storage gate 14 for storage.

At low light levels, the response of the photodetector according to the alternative embodiment is linear. However, at high light levels, the wide dynamic range device 10 becomes operational, causing the photoresponse to become logarithmic.

At the end of the integration period, BCK is set at a logic low level for turning off the transfer gate 9 in order to isolate the photosensing diffusion 2 from the storage region beneath gate 14. Next, the transfer gate 7 is enabled in response to a logic high pulse of signal TCK for transferring the signal charge of electrons from the storage gate 14 into the readout shift register 6.

As with the preferred embodiment, the alternative embodiment overcomes the problem of signal contamination, smearing and blooming by providing gate 9 for isolating the output section of the photodetector from the photosensitive diffusion 2.

Once the signal charge is transferred into the CCD readout shift register 6, the voltage of the photosensitive region 2 is set by enabling the gate 12 via a logic high level signal PR for a short period.

Figure 3A:
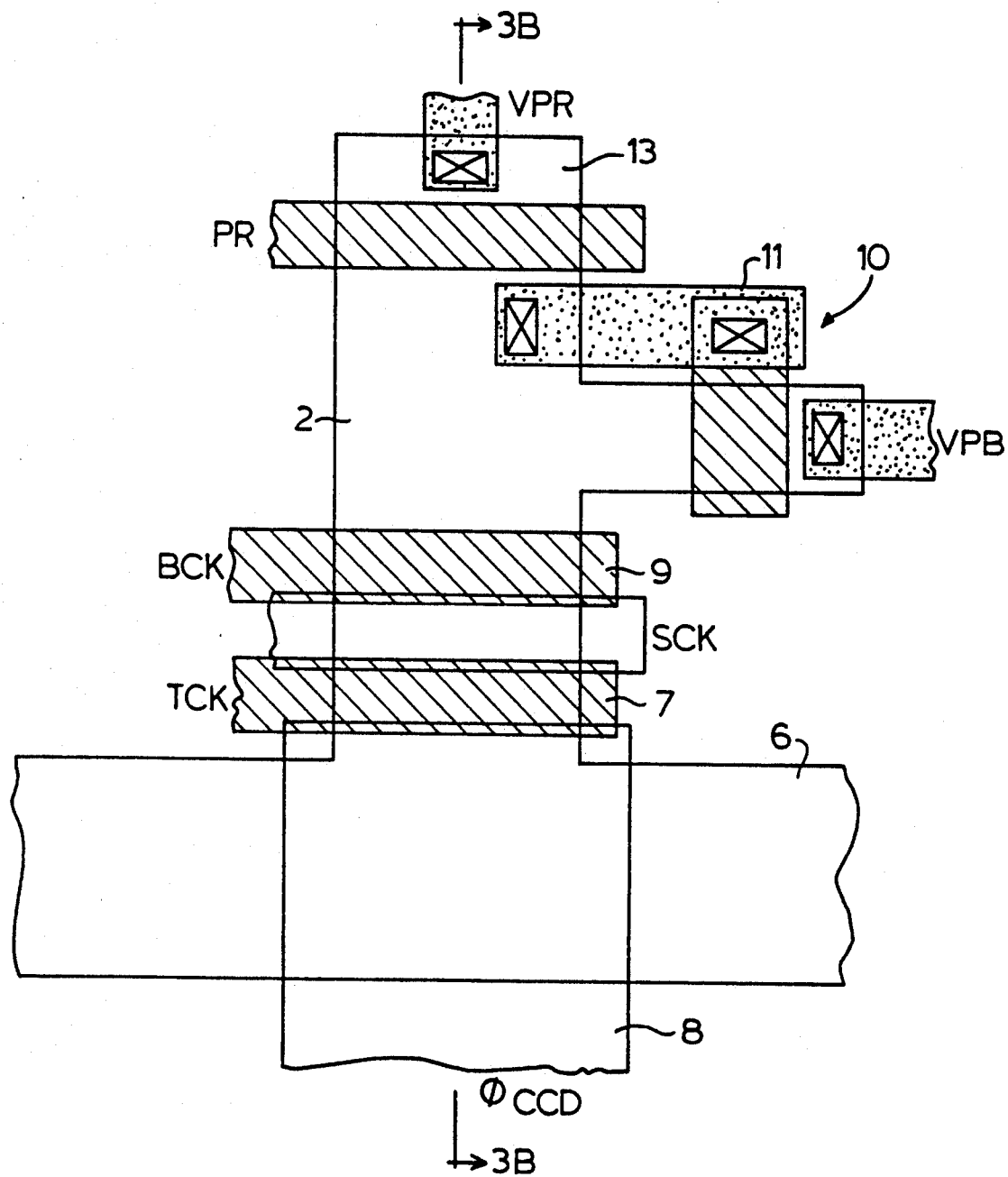
FIG. 3A is an integrated circuit layout of a photodetector in accordance with an alternate embodiment of the present invention.
Figure 3B:
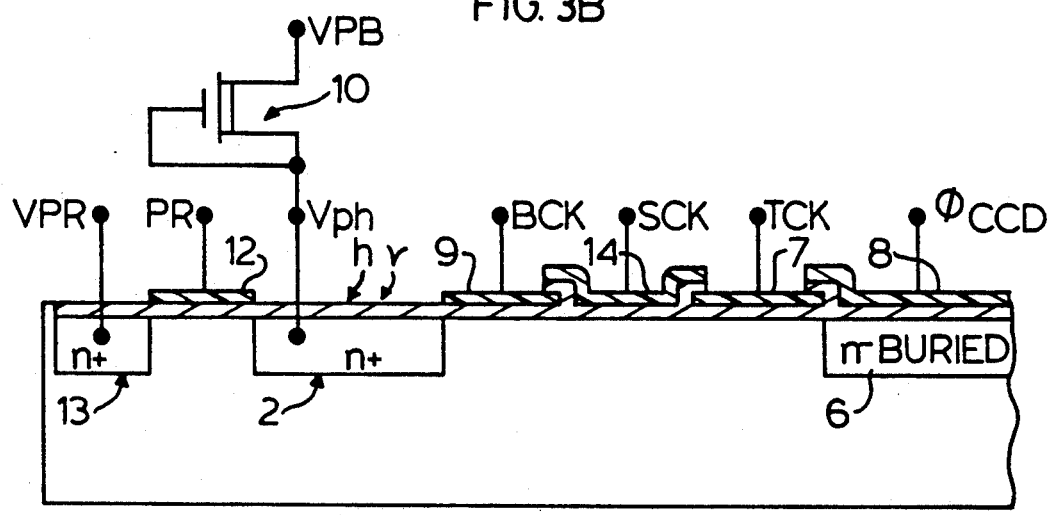
FIGS. 3B and 3C form a combined cross-sectional view and potential well diagram of the photodetector shown in FIG. 3A.
Figure 3C:
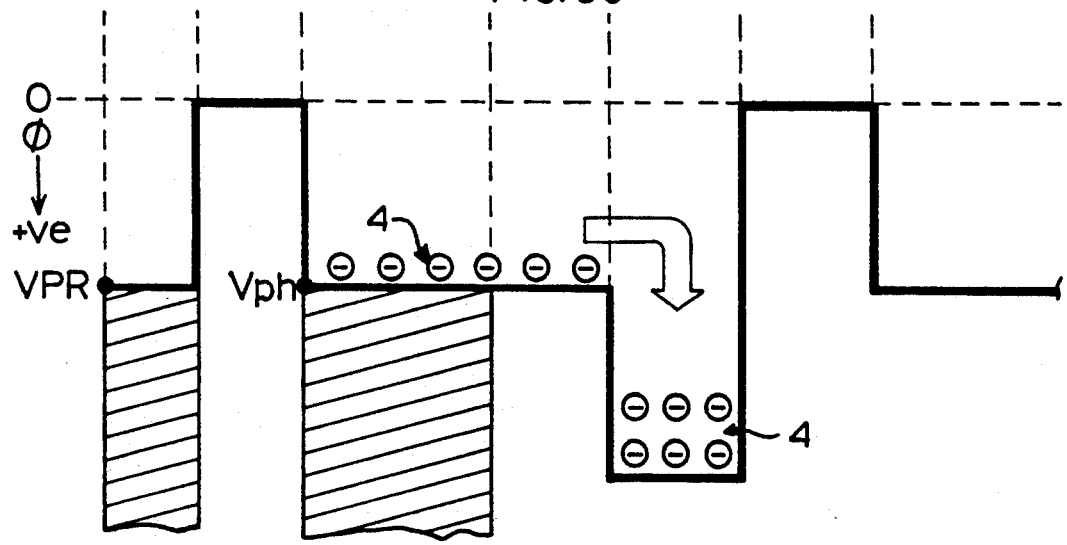

The main advantage of the alternative embodiment of photodetector provided by FIGS. 3A and 3B over conventional wide dynamic range photodetectors is its enhanced photosensitivity at low light levels. Furthermore, the photodetector of FIGS. 3A and 3B provides a linear output response for all integration times, except at high incident light intensity levels where the response becomes logarithmic. At high light levels, the photodetector operates in the conductive mode, whereas at low light levels it integrates the incident photon flux.

The photodetectors disclosed in FIGS. 2A, 2B and 3A, 3B can be realized with silicon, GaAs or other materials, and can be integrated onto a semiconductor chip with charge coupled devices to form linear and area arrays. Furthermore, the photodetectors of the present invention can be integrated on the same chip with MOSFET or other CMOS devices and circuits to form a single photoelement with the relevant output devices and circuits, or to form NMOS or CMOS self-scanned linear or area image sensor arrays. The photodetector of the present invention can also be used in conjunction with CMOS circuits to form randomly accessed linear or area sensor arrays.

Other embodiments or modifications of the present invention are possible within the sphere and scope of the claims appended hereto.

We claim:

1. A wide dynamic range semiconductor photodetector comprising:
    a) a photosensitive region for generating signal electrons in response to being illuminated including,
        a substrate,
        a drain diffusion within said substrate and connected to a source of common drain bias voltage,
        a source diffusion within said substrate for generating said signal electrons in response to being illuminated, and
        a gate region for receiving a predetermined control signal and in response alternately resetting the potential of said common source diffusion to said common drain bias voltage, and isolating said drain and source diffusions during photogeneration of said signal electrons;
    b) a collection region including an additional diffusion in said substrate for storing said signal electrons generated within said photosensitive region;
    c) a shift register for receiving and outputting said signal electrons from said collection region;
    d) a transfer gate intermediate said photosensitive region and said collection region for alternately facilitating transfer of said signal electrons from said photosensitive region for storage in said collection region, and isolating said photosensitive region from said collection region while said signal electrons are being output via said shift register, said additional diffusion separated from said source diffusion by said transfer gate; and
    e) a wide dynamic range profiled device, for setting the potential of said additional diffusion under dark conditions including a FET transistor having a drain terminal connected to a predetermined source of a bias potential, and interconnected gate source terminals connected to said additional diffusion.

2. A wide dynamic range semiconductor photodetector comprising:
    a) a photosensitive region for generating signal electrons in response to being illuminated including,
        a substrate,
        a drain diffusion within said substrate and connected to a source of common drain bias voltage,
        a source diffusion within said substrate for generating said signal electrons in response to being illuminated, and
        a gate region for receiving a predetermined control signal and in response alternately resetting the potential of said source diffusion to said common drain bias voltage, and isolating said drain and source diffusions;
    b) a collection region including a storage gate for receiving a further control signal and in response creating a storage potential well within said substrate for storing said signal electrons generated within said photosensitive region;
    c) a shift register for receiving and outputting said signal electrons from said collection region;
    d) a transfer gate intermediate said photosensitive region and said collection region for alternately facilitating transfer of said signal electrons from said photosensitive region for storage in said collection region, and isolating said photosensitive region from said collection region while said signal electrons are being output via said shift register; and
    e) a wide dynamic range profiled device for causing logarithmic photoresponse within said source diffusion under high illumination levels including a FET transistor having a drain terminal connected to a predetermined source bias potential, and interconnected gate and source terminals connected to said source diffusion.

3. The photodetector as defined in claim 1, wherein said shift register further comprises a buried diffusion within said substrate, a clocking gate disposed over said buried diffusion, and a further transfer gate separating said buried diffusion and clocking gate from said collection region.

4. The photodetector as defined in claim 1, wherein said substrate is comprised of P-type material.

5. The photodetector as defined in claim 1, wherein said drain diffusion and source diffusion are comprised of n+type material.

6. The photodetector of claim 1, wherein said additional diffusion is comprised of n+type material.

7. The photodetector of claim 2, wherein said shift register further comprises a buried diffusion within said substrate, a clocking gate disposed over said buried diffusion, and a further transfer gate separating said buried diffusion and clocking gate from said collection region.

8. The photodetector as defined in claim 2, wherein said substrate is comprised of P-type material.

9. The photodetector as defined in claim 2, wherein said drain diffusion and source diffusion are comprised of n+type material.

* * * * *